United States Patent [19]
Sakamoto et al.
[11] Patent Number: 4,945,332
[45] Date of Patent: Jul. 31, 1990

[54] NOISE SUPPRESSION INDUCTOR

[75] Inventors: Yukio Sakamoto, Fukui; Mamoru Zushi; Masahiro Bando, both of Takefu, all of Japan

[73] Assignee: Murata Manufacturing Co., Ltd., Kyoto, Japan

[21] Appl. No.: 281,900

[22] Filed: Dec. 6, 1988

Related U.S. Application Data

[63] Continuation of Ser. No. 902,954, Sep. 2, 1986, abandoned.

[30] Foreign Application Priority Data

Sep. 3, 1985 [JP] Japan ................................ 60-195040

[51] Int. Cl.[5] ...................... H01F 15/14; H01F 27/30; H03H 7/00

[52] U.S. Cl. ...................................... 336/69; 333/176; 333/177; 336/185; 336/198; 336/210; 379/415

[58] Field of Search ............... 336/192, 198, 208, 185, 336/69, 70, 105, 96, 210, 224; 333/175, 176, 177, 167; 379/415, 416

[56] References Cited

U.S. PATENT DOCUMENTS

| | | | |
|---|---|---|---|
| 1,945,544 | 2/1934 | Conklin | 336/224 |
| 2,568,588 | 9/1951 | Maegeorge | 336/136 X |
| 4,074,210 | 2/1978 | Otake et al. | 336/69 |
| 4,183,002 | 1/1980 | Haslau | 336/192 |
| 4,227,143 | 10/1980 | Elders et al. | 336/180 |
| 4,229,786 | 10/1980 | Mitani et al. | 336/185 |
| 4,427,962 | 1/1984 | Liberman | 336/192 |

FOREIGN PATENT DOCUMENTS

| | | | |
|---|---|---|---|
| 2830128 | 1/1979 | Fed. Rep. of Germany | 336/210 |
| 1392960 | 4/1969 | France | 336/192 |
| 44-381 | 1/1969 | Japan | 336/69 |

OTHER PUBLICATIONS

AT&T Technologies, Curtis III et al., "Ferrite Choke Coil Assembly" Technical Digest No. 76, Mar. 1985, pg. 17.

*Primary Examiner*—Thomas J. Kozma
*Attorney, Agent, or Firm*—Wenderoth, Lind & Ponack

[57] ABSTRACT

A noise suppression inductor including a bobbin having a spool divided into a plurality of spool portions, a core mounted on the bobbin, at least one coil wound around the spool portions into a plurality of coil portions and a plurality of terminal pins connected to opposite ends of the coil, in which the coil portions have different winding widths such that stray capacities produced at the coil portions are made different from each other, whereby the noise suppression inductor has a plurality of self-resonance frequencies.

5 Claims, 5 Drawing Sheets

NOISE SUPPRESSION INDUCTOR

This application is a continuation, of now abandoned application Ser. No. 06/902,954, filed Sept. 2, 1986, now abandoned.

BACKGROUND OF THE INVENTION

The present invention generally relates to inductors and more particularly, to a noise suppression inductor for cancelling noises of a plurality of different frequency bands simultaneously.

In a known noise suppression inductor, as shown in FIG. 1, identical coils 3 and 4 are, respectively, wound, in such directions that magnetic fluxes of the coils 3 and 4 eliminate each other, around two portions of a bobbin 2 divided equally by a flange 1 and the bobbin 2 is fitted around one leg portion of each of a pair of U-shaped cores 5 and 6 which are butted against each other so as to constitute a core 7 of a closed magnetic circuit. The U-shaped cores 5 and 6 are secured by a spring plate 8. In the known noise suppression inductor of the above described arrangement, the coils 3 and 4 exhibit insertion loss characteristics having a single self-resonance frequency f0 which is determined by an inductance of each of the coils 3 and 4 and a stray capacity produced at each of the coils 3 and 4 as shown in FIG. 2.

Recently, in out-pulse dialling telephone sets such as a multifunctional telephone set, two kinds of noises having different frequency bands, for example, one noise of radio wave AM (amplitude modulation) radio broadcasting frequency band ranging approximately from 525 to 1605 KHz and the other noise of radio wave FM (frequency modulation) radio broadcasting frequency band and low channel (channels 1 to 3) TV broadcasting frequency band ranging approximately from 76 to 108 MHz, pose a problem.

Even if the known noise suppression inductor of the above described arrangement is used for cancelling such two kinds of noises having different frequency bands, the known noise suppression inductor having the single self-resonance frequency is merely capable of cancelling the noise of one frequency band. The noises form two different frequency bands cannot be cancelled effectively by the known noise suppression inductor simultaneously. Therefore, in order to effectively cancel such two kinds of noises from different frequency bands, two known noise suppression inductors having self-resonance frequencies falling respectively in the frequency bands of the noises to be cancelled are required to be used. Thus, the known noise suppression inductor has such drawbacks that due to increase of the number of the known noise suppression inductors required therefor cost for cancelling the noises rises and mounting of the known noise suppression inductor becomes troublesome.

SUMMARY OF THE INVENTION

Accordingly, an essential object of the present invention is to provide a noise suppression inductor which is capable of effectively cancelling noises of at least two frequency bands and which can be mounted easily, with substantial elimination of the disadvantages inherent in conventional noise suppression inductors of this kind.

In order to accomplish this object of the present invention, a noise suppression inductor embodying the present invention includes a bobbin having a spool divided into a plurality of spool portions, a core mounted on said bobbin, at least one coil wound around said spool portions into a plurality of coil portions and a plurality of terminal pins connected to opposite ends of said coil, the improvement comprising: said coil portions having winding widths different from each other such that stray capacities produced at said coil portions are different from each other, whereby said noise suppression inductor has a plurality of self-resonance frequencies.

In the noise suppression inductor of the present invention, the coil is divided into a plurality of coil portions wound around the spool portions of the bobbin, respectively such that the stray capacities produced at the coil portions are different from each other by making the winding widths of the coil portions different from each other. Thus, in accordance with the present invention, the noise suppression inductor has a plurality of different self-resonance frequencies which are determined by inductances and stray capacities of the coil portions, respectively.

BRIEF DESCRIPTION OF THE DRAWINGS

This object and features of the present invention will become apparent from the following description taken in thereof taken in conjunction with the preferred embodiments thereof with the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
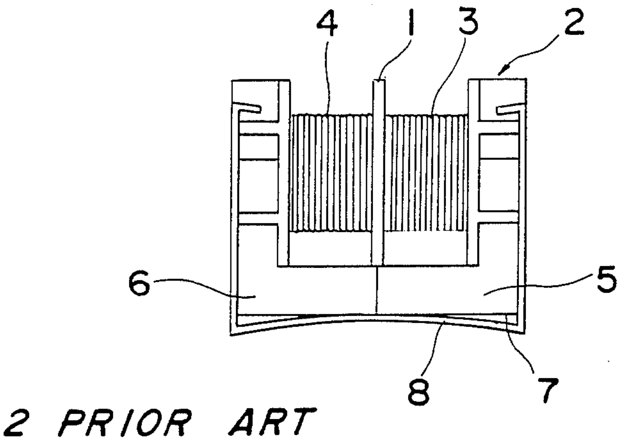
Fig. 1 PRIOR ART
FIG. 1 is a top plan view of a prior art noise suppression inductor (already referred to)
Figure 2:
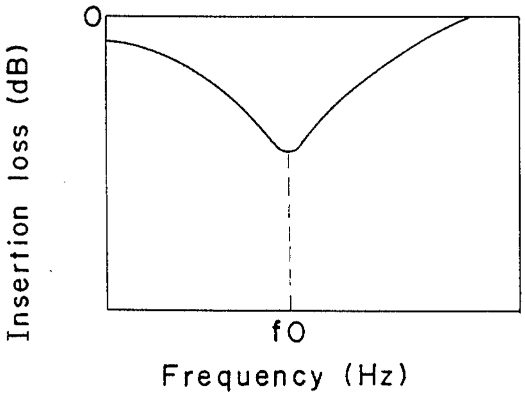
Fig. 2 PRIOR ART
FIG. 2 is a graph indicative of insertion loss characteristics of the prior art noise suppression inductor of FIG. 1 (already referred to)
Figure 3:
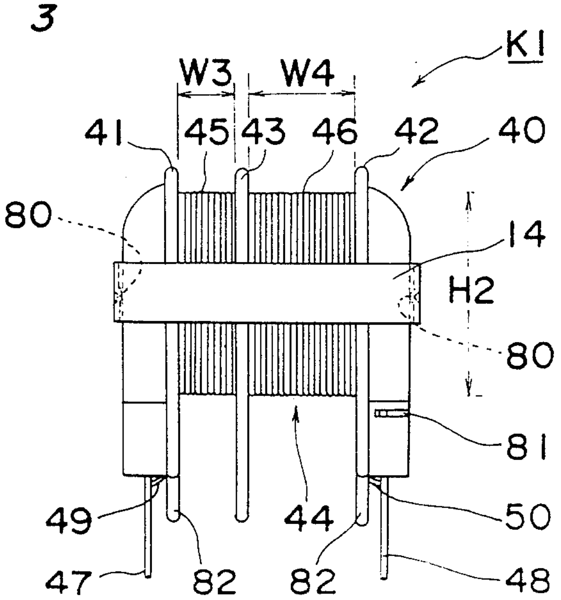
FIGS. 3, 4 and 5 are a front elevational view, a top plan view respectively and a bottom plan view of a noise suppression inductor according to a first embodiment of the present invention, respectively.
Figure 4:
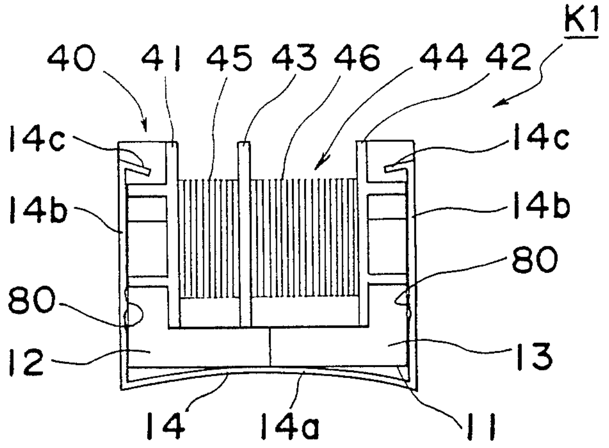
Figure 5:
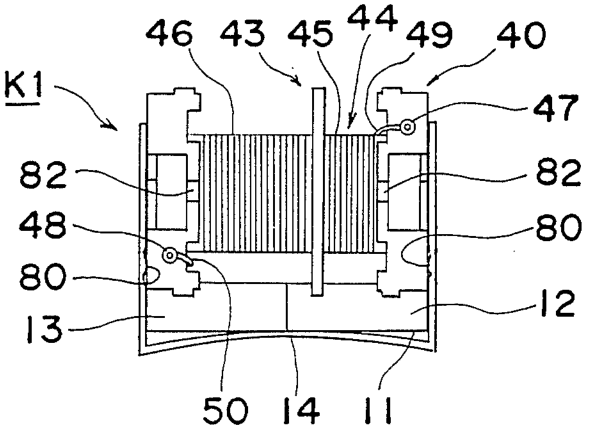

Referring now to the drawings, there is shown in FIGS. 3 to 5, a noise suppression inductor K1 according to a first embodiment of the present invention. The noise suppression inductor K1 includes a core 11 which is a closed magnetic circuit, a bobbin 40, a coil 44 wound around the bobbin 40 and a spring plate 14 fitted around the core 11. The core 11 is constituted by a pair of U-shaped cores 12 and 13 abutted against each other. The bobbin 40 has a pair of flange portions 41 and 42 formed at opposite ends thereof, respectively and a partition plate 43 for unequally dividing a spool between the flange portions 41 and 42 into two spool portions having winding widths W3 and W4, respectively, in the direction of the length of the core with the winding width W3 being smaller than the winding width W4. The coil 44 is wound around the spool so as to be divided by the partition plate 43 into coil portions 45 and 46 having the winding widths W3 and W4, respectively. The coil portions 45 and 46 are formed to a substantially identical diameter H2. However, since the winding width W3 is smaller than the winding width W4 as described above, the stray capacity produced at the coil portion 45 having the winding width W3 is smaller than the stray capacity produced at the coil portion 46 having the winding width W4. The noise suppression inductor K1 further includes a pair of lead terminals 47 and 48 projecting vertically from opposite end portions of a bottom face of the bobbin 40 and opposite ends 49 and 50 of the coil 44 are, respectively, connected to the lead terminals 47 and 48 by soldering, etc.

Figure 6:
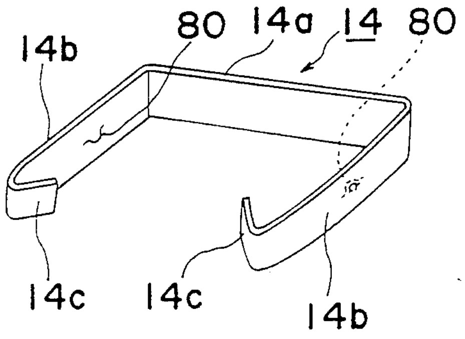
FIG. 6 is a perspective view of a spring plate employed in the noise suppression inductor of FIG. 3.

As shown in FIG. 6, the spring plate 14 has a substantially U-shaped configuration and includes a base portion **14*a*, a pair of leg portions 14*b* extending from opposite ends of the base portion 14*a* and a pair of bent portions 14*c* each formed at the distal end of each of the leg portions 14*b*. The spring plate 14 further has a pair of protrusions 80 extending inwardly towards each other, which are formed by punching the leg portions 14*b*, respectively. When the spring plate 14 has been fitted around the core 11 through engagement of the bent portions 14*c* with the bobbin 40, the protrusions 80 of the spring plate 14 are brought into pressing contact with the core 11 so as to elastically urge the U-shaped cores 12 and 13** against each other.

Figure 7:
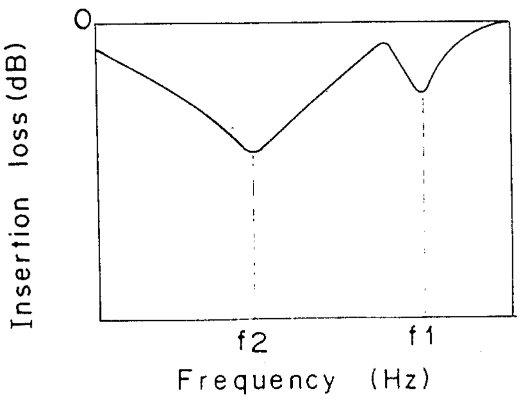
FIG. 7 is a graph indicative of insertion loss characteristics of the noise suppression inductor of FIG. 3.

By the above described arrangement of the noise suppression inductor K1, since the coil 44 is divided into the coil portions 45 and 46 having the winding widths W3 and W4 different from each other, the noise suppression inductor K1 exhibits insertion loss characteristics having two self-resonance frequencies f1 and f2 as shown in FIG. 7. Namely, since both the inductance and the stray capacity of the coil portion 45 having the smaller winding width W3 are small, the coil portion 45 exhibits insertion loss characteristics having the higher self-resonance frequency f1. On the other hand, since both an inductance and the stray capacity of the coil portion 46 having the larger winding width W4 are large, the coil portion 46 exhibits insertion loss characteristics having the lower self-resonance frequency f2.

Thus, these self-resonance frequencies f1 and f2 can be set to arbitrary values by changing, by a change of the winding widths W3 and W4 of the coil portions 45 and 46, the inductances and the stray capacities produced at the coil portions 45 and 46, respectively.

Accordingly, in the case where two kinds of noises having different frequency bands, for example, one noise of radio wave AM (amplitude modulation) radio broadcasting frequency band ranging approximately from 525 to 1605 KHz and the other noise of radio wave FM (frequency modulation) radio broadcasting frequency band and low channels (channels 1 to 3) of TV broadcasting frequency band ranging approximately from 76 to 108 MHz are cancelled in out-pulse dialling telephone sets such as a multifunctional telephone set by using the noise suppression inductor K1, the winding widths W3 and W4 of the coil portions 45 and 46 are required to be set such that the self-resonance frequencies f1 and f2 fall in the frequency bands of the noises to be cancelled. In this case, in order to cancel the noises more effectively, it is desirable that the self-resonance frequencies f1 and f2 are, respectively, set to central values of the frequency bands of the noises, for example, 92 MHz and 1065 KHz.

Figure 9:
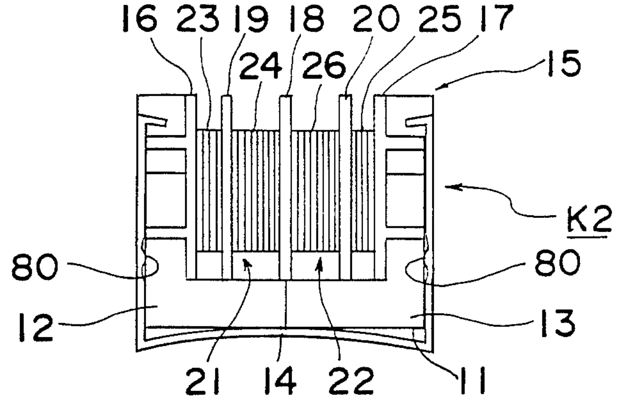
FIGS. 8, 9 and 10 are views similar to FIGS. 3, 4 and 5, respectively, particularly showing a second embodiment of the present invention.
Figure 10:
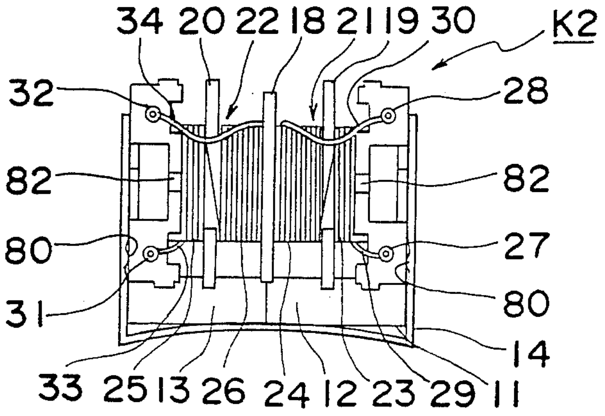
Figure 8:
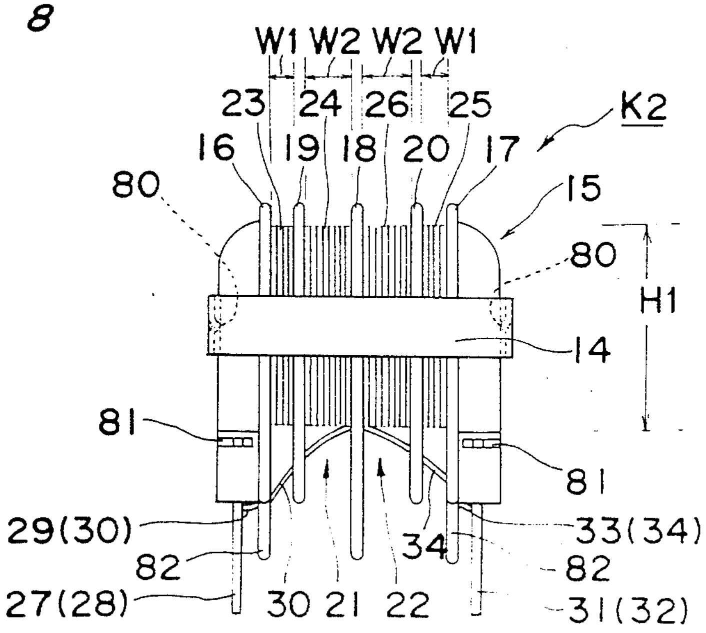

Referring to FIGS. 8 to 10, there is shown a noise suppression inductor K2 according to a second embodiment of the present invention. The noise suppression inductor K2 includes a bobbin 15 and two coils 21 and 22 wound around the bobbin 15 in such directions that magnetic fluxes of the coils 21 and 22 eliminate each other. The bobbin 15 has a pair of flange portions 16 and 17 formed at opposite ends thereof, a central flange 18 for equally dividing the spool between the flange portions 16 and 17 into two spool halves, a partition plate 19 for unequally dividing the spool half between the flange portion 16 and the central flange 18 into spool portions having different winding widths W1 and W2, respectively and a partition plate 20 for unequally dividing the spool half between the flange portion 17 and the central flange 18 into spool portions having the winding widths W1 and W2, respectively. The coil 21 is wound around the spool half between the flange portion 16 and the central flange 18 so as to be divided by the partition plate 19 into coil portions 23 and 24 having the winding widths W1 and W2, respectively. Likewise, the coil 22 is wound around the spool half between the flange portion 17 and the central flange 18 so as to be divided by the partition plate 20 into coil portions 25 and 26 having the winding widths W1 and W2, respectively. Namely, the coil 21 is wound around the spool portion having the winding width W1 between the flange portion 16 and the partition plate 19 so as to be formed into the coil portion 23 and then, is successively wound around the spool portion having the winding width W2 between the partition plate 19 and the central flange 18 so as to be formed into the coil portion 24. Similarly, the coil 22 is wound around the spool portion having the winding width W1 between the flange portion 17 and the partition plate 20 so as to be formed into the coil portion 25 and then, is successively wound around the spool portion having the winding width W2 between the partition plate 20 and the central flange 18 so as to be formed into the coil portion 26. The coil portions 23, 24, 25 and 26 are formed to a substantially identical diameter H1. However, since the winding width W1 is smaller than the winding width W2, the stray capacity produced at the coil portions 24 and 26 becomes larger than the capacity produced at the coil portions 23 and 25. The noise suppression inductor K2 further includes a pair of lead terminals 27 and 28 projecting vertically from a bottom face of the flange portion 16 of the bobbin 15 and a pair of lead terminals 31 and 32 projecting vertically from a bottom face of the flange portion 17. Opposite ends 29 and 30 of the coil 21 are connected to the lead terminals 27 and 28, respectively by soldering, etc. Likewise, opposite ends 33 and 34 of the coil 22 are connected to the lead terminals 31 and 32, respectively by soldering, etc. Since other features of the noise suppression inductor K2 are similar to those of the noise suppression inductor K1, a detailed description thereof is omitted for the sake of brevity.

By the above described arrangement of the noise suppression inductor K2, since the coils 21 and 22 are, respectively, divided into the two coil portions 23 and 24 having the different winding widths and the two coil portions 25 and 26 having the different winding widths, each of the coils 21 and 22 exhibits the insertion loss characteristics having the two self-resonance frequencies f1 and f2 as shown in FIG. 7. Namely, since both the inductance and the stray capacity of the coil portions 23 and 25 having the smaller winding width W1 are small, the coil portions 23 and 25 exhibit insertion loss characteristics having the higher self-resonance frequency f1. On the other hand, since both the inductance and the stray capacity of the coil portions 24 and 26 having the larger winding width W2 are large, the coil portions 24 and 26 exhibit insertion loss characteristics having the lower self-resonance frequency f2. Since the coil portions 23 and 24 and the coil portions 25 and 26 are connected to each other in series so as to constitute the coils 21 and 22, respectively, the noise suppression inductor K2 has the insertion loss characteristics of FIG. 7 which are obtained by combining the insertion loss characteristics of the coil portions 23 and 24 of the coil 21 and the coil portions 25 and 26 of the coil 22.

Needless to say the noise suppression inductor of the present invention can be modified in various ways. For example, it can also be so arranged that the number of parts of the coil is three or more such that the noise suppression inductor has not less than three different self-resonance frequencies.

As is clear from the foregoing description, in accordance with the present invention, noises having at least two kinds of frequency bands can be cancelled effectively by the single noise suppression inductor and thus, the noise suppression inductor can be mounted easily without incurring such inconveniences leading to rise in cost for cancelling the noises as an increase of the number of the noise suppression inductors required therefor.

Hereinbelow, the bobbin 40 employed in the noise suppression inductor K1 will be described in detail with reference to FIGS. 11 to 16. The bobbin 40 is an integrally molded item made of synthetic resin and includes a spool 61 having the shape of, for example, a rectangular tube, a pair of the opposed flange portions 41 and 42 formed at opposite ends of the spool 61 around a through hole 62 thereof and the partition plate 43, between the flange portions 41 and 42 and extending, from the outer periphery of the spool 61 in parallel with the flange portions 41 and 42. A pair of mounting bosses 65 each having a flat upper face are formed on lower end portions of the flange portions 41 and 42, respectively so as to project outwardly in the axial direction of the spool 61. A pair of first play regulating walls 66 are formed at a vertically intermediate position of each of the flange portions 41 and 42 so as to confront and extend in parallel with the upper face of each of the mounting bosses 65. A first guide portion 67 having a substantially U-shaped vertical section is formed by a lower face of the first play regulating walls 66, the upper face of each of the mounting bosses 65 and the lower end portion of each of the flange portions 41 and 42. A pair of second play regulating walls 68 are formed at opposed ends of the first play regulating walls 66 so as to extend vertically upwardly from the first play regulating walls 66 at right angles to the first play regulating walls 66, respectively. A second guide portion 69 having a substantially U-shaped horizontal section is formed by the second play regulating walls 68 and an upper central portion of each of the flange portions 41 and 42.

As best shown in FIGS. 13 to 16, the bobbin 40 has a pair of slits 81 formed at the lead terminals 47 and 48, respectively and a pair of projections 82 formed on the bottom portions of the flange portions 41 and 42, respectively. The lead terminals 47 and 48 are extended from below the mounting bosses 65 into the slits 81. The lead terminals 47 and 48 are not necessarily required to be extended into the slits 81. The slits 81 are provided for discharging from the bobbin 40 gas produced at the time of soldering of the coil 44 to the lead terminals 47 and 48. The projections 82 extend downwardly to a position identical with that of the partition plate 43 beyond soldered portions of the coil 44 to the lead terminals 47 and 48. When the noise suppression inductor K1 is mounted on a substrate, the projections 82 and the partition plate 43 are brought into contact with the substrate so as to be spaced from the substrate the soldered portions soldering the coil 44 to the lead terminals 47 and 48. Thus, the soldered portions of the coil 44 soldered to the lead terminals 47 and 48 are protected from damage through contact of the projections 82 and the partition plate 43 with the substrate at the time of mounting of the noise suppression inductor K1 on the substrate.

Figure 11:
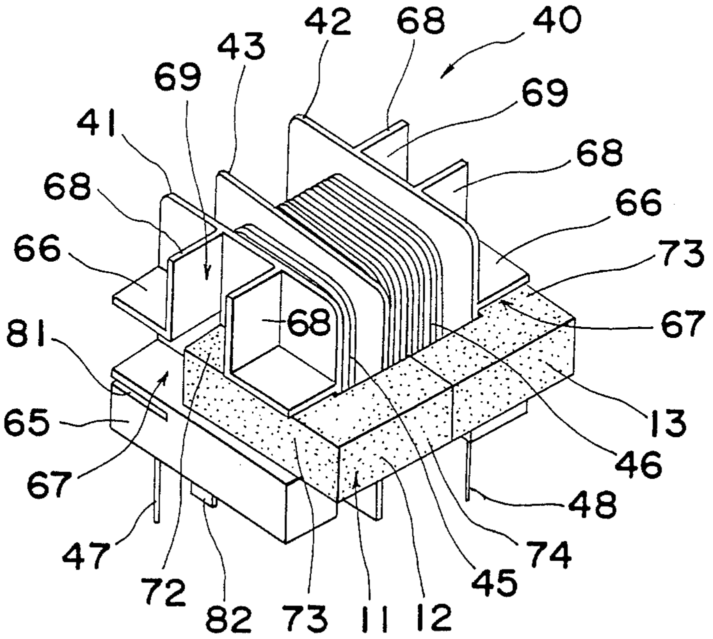
FIG. 11 is a perspective view of the noise suppression inductor of FIG. 3.

FIG. 11 shows the noise suppression inductor K1 in which the core 11 is horizontally mounted on the bobbin 40. Each of the U-shaped cores 12 and 13 has a base portion 73 and a pair of leg portions 72 and 74 extending from opposite ends of the base portion 73. After the coil 44 has been wound around the spool 61, the leg portions 72 of the U-shaped cores 12 and 13 are fitted into the through-hole 62 from its opposite ends, respectively so as to be butted against each other in the through-hole 62 and the leg portions 74 are butted against each other at one side of the bobbin 40. At this time, the base portions 73 of the U-shaped cores 12 and 13 are inserted in the first guide portions 67 such that the core 11 is prevented from being moved vertically. It is to be noted that the core 11 can be disposed on either one of the opposite sides of the bobbin 40 as shown by the imaginary lines in FIG. 16.

Figure 12:
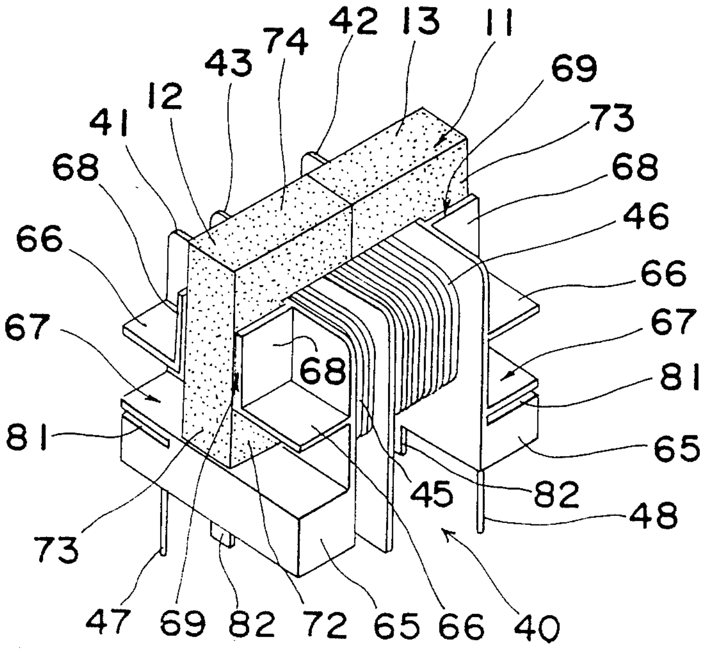
FIG. 12 is a view similar to FIG. 11, particularly showing a modification thereof.
Figure 13:
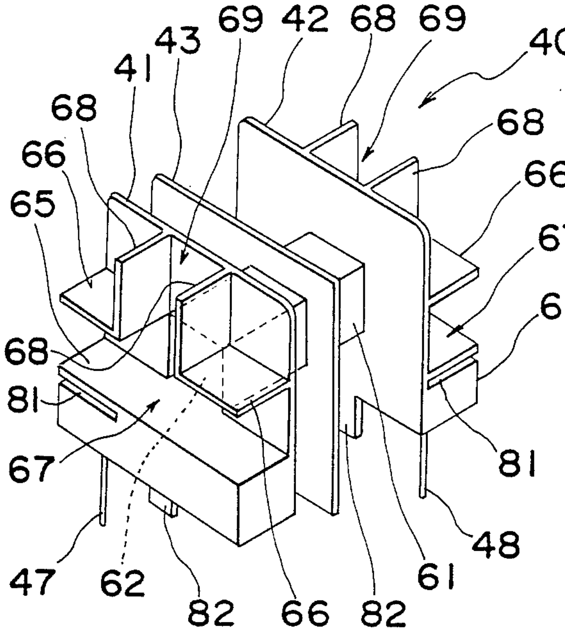
FIG. 13 is a perspective view of a bobbin employed in the noise suppression inductor of FIG. 3.
Figure 14:
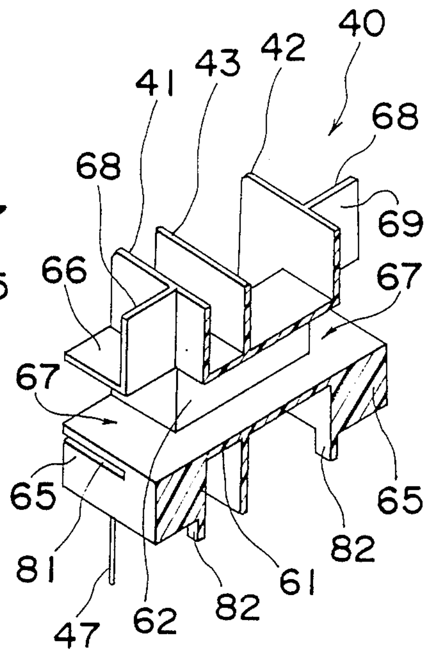
FIG. 14 is a perspective sectional view of the bobbin of FIG. 13.
Figure 15:
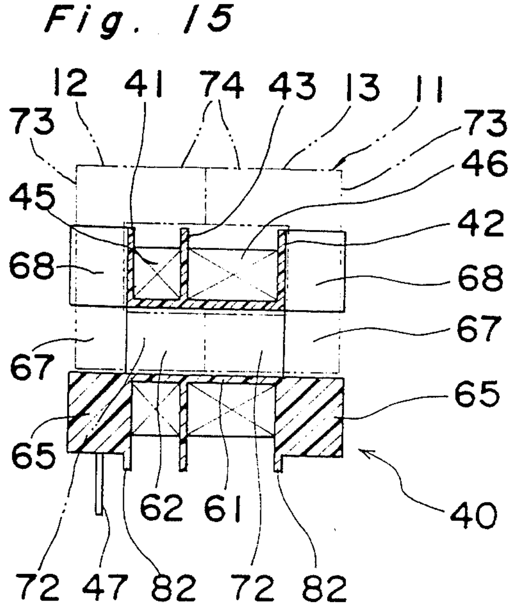
FIG. 15 is a longitudinal sectional view of the bobbin of FIG. 13.
Figure 16:
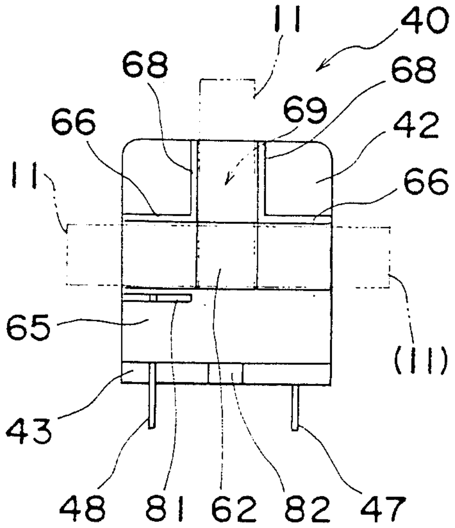
FIG. 16 is a side elevational view of the bobbin of FIG. 13.

FIG. 12 shows a modification of the noise suppression inductor K1, in which the core 11 is vertically mounted on the bobbin 40. In this case, the leg portions 74 of the U-shaped cores 12 and 13 are butted against each other above the bobbin 40. At this time, the base portions 73 of the U-shaped cores 12 and 13 are, respectively, inserted in the second guide portions 69, i.e. between the second play regulating walls 68 such that the core 11 is prevented from being moved sidewise. It is to be noted that the spring plate 14 is not shown in FIGS. 11 and 12 but is not necessarily required to be provided.

As will be seen from the description given so far, in the bobbin of the present invention, the vertical and horizontal guide portions for regulating vertical and horizontal play of the opposite base portions of the core, respectively are formed. Therefore, if the base portions of the core are inserted into the vertical guide portions, a vertical core type noise suppression inductor can be obtained. On the other hand, if the base portions of the core are inserted into the horizontal guide portions, a horizontal core type noise suppression inductor can be obtained.

Accordingly, in accordance with the present invention, the horizontal core type noise suppression inductor and the vertical core type noise suppression inductor having different heights and different mounting areas can be selectively obtained for various dimensional mounting conditions by using the single bobbin and the single core without changing the characteristics of the noise suppression inductor.

Furthermore, in accordance with the present invention, only one mold is required for manufacturing the bobbin, thereby resulting in reduction of production cost of the bobbin.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A noise suppression inductor comprising:

a bobbin having first and second flange portions at opposite ends thereof, respectively, a central flange portion at a substantially central location between said first and second flange portions and at least one partition plate between each of said first and second flange portions and said central flange portion, said partition plates dividing the respective distances between said first and second flange portions and said central flange portion so as to form a plurality of coil winding portions having different winding widths, respectively;

a core mounted on said bobbin;

a pair of first pin terminals and a pair of second pin terminals which are attached to said bobbin;

first and second coils which have first opposite ends and second opposite ends, respectively, said first opposite ends of said first coil, respectively, being connected to said first pin terminals, and said second opposite ends of said second coil being, respectively, connected to said second pin terminals;

said first and second coils each being wound around said coil winding portions through said partition plate so as to form a plurality of coil portions on said coil winding portions, respectively, such that magnetic fluxes of said first and second coils eliminate each other;

said coil portions of each of said first and second coils having a plurality of different stray capacities, respectively, so as to have a plurality of different self-resonance frequencies, respectively, whereby when said first and second coils are connected in a circuit with noise in the range of said self-resonance frequencies, each of said first and second coils is capable of cancelling noises of a plurality of different frequency bands.

2. A noise suppression inductor as claimed in claim 1, wherein said coil portions are substantially identical in diameter.

3. A noise suppression inductor as claimed in claim 1, wherein said core is a closed magnetic circuit.

4. A noise suppression inductor as claimed in claim 1, wherein said core is constituted by a pair of core portions, said noise suppression inductor further including a spring plate for elastically pressing said core portions against each other.

5. A noise suppression inductor as claimed in claim 1, wherein said terminal pins are disposed at corner portions of said bobbin, respectively.

* * * * *